US006662037B2

(12) United States Patent
Foo

(10) Patent No.: US 6,662,037 B2
(45) Date of Patent: *Dec. 9, 2003

(54) METHOD AND APPARATUS TO IMPROVE MYOCARDIAL INFARCTION DETECTION WITH BLOOD POOL SIGNAL SUPPRESSION

(75) Inventor: Thomas K. F. Foo, Rockville, MD (US)

(73) Assignee: GE Medical Systems Global Technology Co., LLC, Waukesha, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/248,159

(22) Filed: Dec. 20, 2002

(65) Prior Publication Data

US 2003/0069496 A1 Apr. 10, 2003

Related U.S. Application Data

(63) Continuation of application No. 09/681,081, filed on Dec. 29, 2000, now Pat. No. 6,526,307.

(51) Int. Cl.[7] .................................................. A61B 5/05
(52) U.S. Cl. ........................................ 600/413; 600/420
(58) Field of Search ............................... 600/413, 420, 600/410, 419; 324/306, 307, 309

(56) References Cited

U.S. PATENT DOCUMENTS

| 4,678,995 A | * | 7/1987 | Avison et al. | 324/309 |
| 5,999,839 A | * | 12/1999 | Hardy et al. | 600/413 |
| 6,205,349 B1 | | 3/2001 | Kim et al. | |

OTHER PUBLICATIONS

Journal of the American Heart Association: Circulation; vol. 100, No. 19, Nov. 9, 1999; pp. 1–14.
Journal of the American Heart Association: Circulation; vol. 97, no. 8, Mar. 3, 1998; pp. 1–11.

* cited by examiner

Primary Examiner—Quang T. Van
(74) Attorney, Agent, or Firm—Ziolkowski Patent Solutions Group, LLC; Michael A. Della Penna; Carl B. Horton

(57) ABSTRACT

A method and apparatus-are disclosed for achieving suppression of blood pool signal to detect myocardial infarction using MR technology. An RF pulse sequence is applied that includes a notched inversion RF pulse designed to suppress blood pool in and around a region-of-interest. MR data is then acquired within the region-of-interest that not only has signals from normal myocardial tissue suppressed, but also has blood pool signal suppression to improve delineation of infarcted myocardium from the ventricular blood pool and normal myocardium.

21 Claims, 2 Drawing Sheets

METHOD AND APPARATUS TO IMPROVE MYOCARDIAL INFARCTION DETECTION WITH BLOOD POOL SIGNAL SUPPRESSION

CROSS REFERENCE TO RELATED APPLICATIONS

This application is a continuing application and claims priority of U.S. Ser. No. 09/681,081 filed Dec. 29, 2000 now U.S. Pat. No. 6,526,307.

BACKGROUND OF INVENTION

The present invention relates generally magnetic resonance imaging (MRI), and more particularly, to a method and apparatus, including a new pulse sequence, to achieve greater sensitivity in detecting infarcted myocardial tissue.

MRI utilizes radio frequency pulses and magnetic field gradients applied to a subject in a strong magnetic field to produce viewable images. When a substance containing nuclei with net nuclear magnetic moment, such as the protons in human tissue, is subjected to a uniform magnetic field (polarizing field $B_0$), the individual magnetic moments of the spins in the tissue attempt to align with this polarizing field (assumed to be in the z-direction), but precess about the direction of this magnetic field at a characteristic frequency known as the Larmor frequency. If the substance, or tissue, is subjected to a time-varying magnetic field (excitation field $B_1$) applied at a frequency equal to the Larmor frequency, the net aligned moment, or "longitudinal magnetization", $M_Z$, may be nutated, or "tipped", into the x-y plane to produce a net transverse magnetic moment $M_t$. A signal is emitted by the excited spins after the excitation signal $B_1$ is terminated (as the excited spins decays to the ground state) and this signal may be received and processed to form an image.

When utilizing these signals to produce images, magnetic field gradients ($G_x G_y$ and $G_z$) are employed. Typically, the region to be imaged is scanned by a sequence of measurement cycles in which these gradients vary according to the particular localization method being used. The resulting MR signals are digitized and processed to reconstruct the image using one of many well-known reconstruction techniques.

Myocardial infarction is a type of cardiac syndrome in which oxygen is deprived from a portion of the heart. The size of the myocardial infarct has been demonstrated to have a strong correlation with patient outcome/recovery. Myocardial perfusion imaging is a technique in which regions of abnormal or impaired blood flow to the heart are detected by tracking the passage of a tracer or contrast agent through myocardial tissue. Regions of impaired blood flow or poor perfusion would not exhibit the presence of the contrast material or tracer whereas in tissues with normal perfusion, the presence of the contrast material or tracer would be indicated.

The imaging of tissue (blood) perfusion is closely related to the imaging of blood flow in vascular structures, such as in MR angiography (MRA). As with MRA, MR perfusion imaging is performed by injecting a volume a contrast agent, such as gadolinium chelate, into the blood stream, conventionally via an intravenous injection. The volume or mass of contrast agent administered is typically referred to as a bolus as it is delivered in a tight volume at a relatively high volume delivery rate (usually 1–5 ml/sec). Differing agents can either decrease the $T_1$ of blood to enhance the detected MR signal, or decrease the $T_2$ of blood to attenuate the detected MR signal. As the bolus passes through the body, the enhanced or attenuated signal increases or decreases the signal intensity observed in perfused tissue, but not in the non-perfused tissue. The degree of signal change in the observed tissue as compared with baseline images acquired prior to the arrival of the contrast material can be used to determine the degree of tissue perfusion. Since perfusion measurements are based on the change in tissue signal intensity between the baseline and during the first pass passage of the contrast material, it is important that the MR signal strength be made insensitive to variations from other factors unrelated to the primary mechanism for signal intensity changes due to perfusion. One such variable is the magnitude of the longitudinal magnetization $M_z$, which is tipped into the transverse plane by the RF excitation pulse in the MR pulse sequence. After each excitation, the longitudinal magnetization is reduced and recovers magnitude at a rate determined by the $T_1$ constant of the particular spins being imaged. If another pulse sequence is played out before the longitudinal magnetization has fully recovered, the magnitude of the acquired MR signal will be less than the signal produced by a pulse sequence which is delayed long enough to allow full recovery of the longitudinal magnetization. Moreover, if the delay time varies as a result of variations in the patient's cardiac heart rate, the amount of longitudinal magnetization available will vary between heartbeat to heartbeat. This will cause fluctuations or variations in the signal intensity in the myocardial tissue independent of perfusion. It is known that the use of a saturation RF pulse with a flip angle of 90° will set the longitudinal magnetization to zero. Thus by waiting a pre-determined and fixed time after the saturation RF pulse before imaging, the re-growth the longitudinal magnetization is dependent on the tissue spin-lattice relaxation time, $T_1$. Since the contrast agent effects $T_1$, the use of a saturation RF pulse will yield a signal intensity that is dependent on the concentration of the contrast material present in a region of myocardial tissue and not variations in the patient's heart rate. The same technique is also applicable to $T_2$ or $T_2^*$ shortening agents.

Typically, perfusion imaging is a technique used to rapidly acquire images during the first pass of the contrast agent/bolus through the blood stream by using carefully optimized pulse sequence parameters. The goal of myocardial perfusion imaging is to detect and characterize any abnormal distribution of myocardial blood flow. Perfusion deficits are indicative of areas of compromised blood flow. These perfusion deficits may be transient, whereby the region of myocardial tissue is still viable and continues to receive some supply of blood, or acute where the blood flow to that region has been compromised sufficiently to render cellular damage to the myocardial tissue (i.e., myocardial infarction). Non-viable infarcted tissue undergoes cellular changes that damage the ability of the myocardial tissue or muscle to contract. Hence, regions of myocardial infarction are often characterized by having abnormal cardiac wall motion at rest. Under certain conditions where the tissue is still viable, with increased blood flow to that region, the myocardial tissue begins normal contractile motion. This type of characteristic is attributed to stunned or hibernating myocardium where the tissue is still viable but severely under perfused.

The area of cellular damage or myocardial infarction is often assessed to better determine the course of patient management. In some cases, in the periphery of the infarcted tissue, some recovery of function may be possible. However, in regions where the damage leads to micro-vascular obstruction, no recovery is possible. The use of imaging of myocardial infarcted regions allows the assessment of the extent of the cardiac injury and permits the monitoring of the patient's response to a specific treatment regimen.

In order to assess for the presence of myocardial infarction, an inversion recovery pulse sequence is routinely employed to suppress normal myocardial tissue subsequent to the administration of the contrast bolus, which is typically between 0.1 and 0.2 mmol/kg of gadolinium contrast material. In this application, the bolus has the effect of shortening the $T_1$ time of the blood.

During the first pass of the contrast material, under resting conditions, the infarcted region may be identified by regions of abnormal perfusion. That is to say, the infarcted zones, having very low blood perfusion would be hypo-intense relative to normal, healthy myocardium. With recirculation of the contrast material, transport of the contrast material to the site of the myocardial infarct is by the limited blood flow to the affected region or by diffusion into the extra-cellular space. Consequently, the uptake of contrast material by infarcted tissue occurs at a much slower rate than normal, healthy myocardial tissue. As the uptake of the contrast material is slow, so is the wash-out of the contrast material from the infarcted zones. This yields a phenomena whereby the infarcted region is hypo-intense during the first pass of the contrast material, reaches iso-intensity at some point in time, and at a much later or delayed time following the initial administration of contrast material, is hyper-intense relative to the normal, healthy myocardium.

Since gadolinium contrast material will concentrate in infarcted tissue, an inversion recovery magnetization preparation pulse sequence is designed with an inversion time, TI, to suppress signal from normal, healthy myocardial tissue to yield regions with high signal intensity in the infarcted zones. However, as the concentration of contrast material in the blood is still relatively high, but less than that in infarcted tissue, the ventricular blood pool will still exhibit high signal intensity relative to the infarcted tissue such that delineation of the myocardial boundaries with the ventricular blood pool cavity is difficult. That is, an MR image of blood acquired using a fast gradient echo pulse sequence, or similar technique, will display blood with a high signal intensity with respect to adjacent stationary tissue of the vessel structure. However, it is important in the diagnosing of the extent of myocardial infarction to be able to discriminate between the margins of the infarcted tissue, especially sub-endocardially, and the ventricular blood cavity.

It would therefore be desirable to have a method and apparatus that is capable of myocardial infarction detection with suppression of blood pool signal, in order for the myocardial borders to be accurately defined against a low signal intensity background of normal myocardial tissue or blood in the left ventricle.

BRIEF DESCRIPTION OF INVENTION

The present invention relates to a technique for acquiring MR images to detect infarcted myocardial tissue that solves the aforementioned problems.

The invention includes the use of a blood suppression pulse used in conjunction with an inversion recovery pulse in a gated, segmented k-space gradient echo acquisition to improve the delineation of infarcted myocardium from the ventricular blood pool. The technique uses a notched inversion RF pulse with a stop-band positioned over the imaged slice. In this manner, the contrast in the imaged slice is unaffected by the blood suppression pulse. The inversion time is chosen such that blood inverted in the pass-band of the notched RF pulse, will be at or close to the null point at the time of the gradient echo read-out segment. It is expected that the concentration of the contrast material in the infarcted zones is higher than in the normal, healthy myocardium about 5–15 minutes after the administration of the contrast material. Since the concentration of the contrast material in blood is higher than that of the normal, healthy myocardium, signal intensity of the ventricular blood is higher than that of the normal myocardium. The relative concentration of the contrast material between the infarcted tissue and blood is not well defined as it is affected by several physiological factors. It is safe to assume that the concentration of contrast agent in the ventricular blood is at least as high as that in the infarcted tissue, leading to both tissues having similar $T_1$ relaxation times and similar signal intensities.

It is thus desirable to employ a technique that suppresses signal from the ventricular blood and not from the infarcted region. A conventional slice-selective inversion pulse would null signal from both blood and the infarcted tissue. A solution to this problem requires a new approach for blood suppression while leaving the signal from the infarcted zone relatively unaffected.

The notched inversion pulse inverts the spins of blood outside of the imaged slice while not affecting the spins in the imaged slice. At some time after the applied notched inversion pulse, selected for the time needed to null signal from contrast-enhanced blood, blood from within the imaged slice would be replaced by spins from outside of the slice, thereby achieving blood suppression without affecting the signal from the infarcted zones.

In accordance with one aspect of the invention, a method of acquiring MR images with blood pool suppression includes applying a pulse sequence that includes a notched inversion pulse. The notched inversion pulse is designed to suppress blood pool about the region-of-interest.

In accordance with another aspect of the invention, an MR pulse sequence is disclosed a notched inversion RF pulse. The notched inversion RF pulse is transmitted after a primary slice-selection inversion RF pulse and has a stop-band coincident with that of the primary slice-selective inversion RF pulse.

In accordance with yet another aspect of the invention, a computer system is disclosed for use with an MRI apparatus having a computer programmed transmit a notched inversion RF pulse with an inversion time selected to invert regions outside a desired imaging slice such that signals from blood flowing into the desired imaging slice are suppressed.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention. In the drawings.

DETAILED DESCRIPTION

Figure 1:
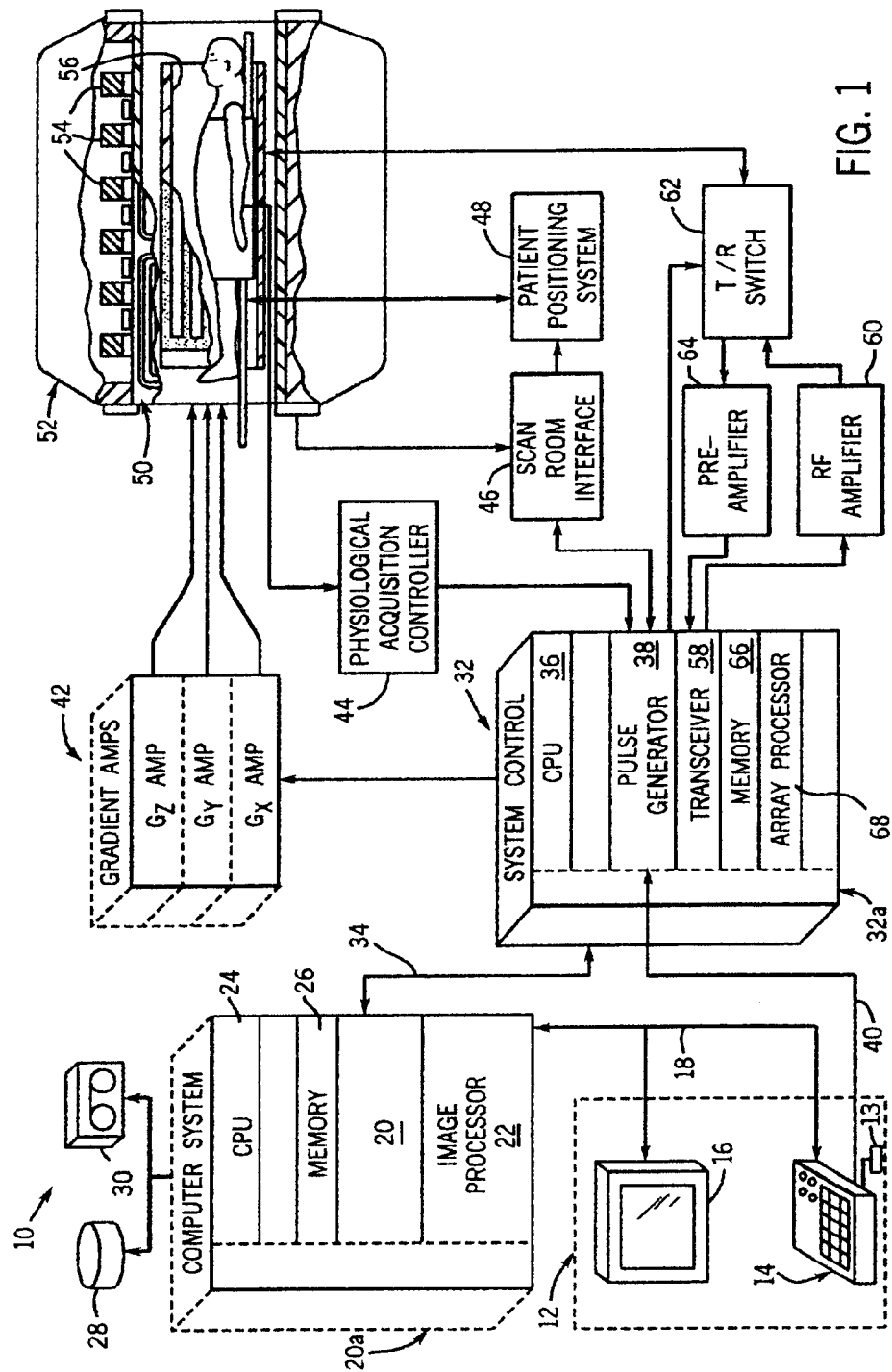
FIG. 1 is a schematic block diagram of an NMR imaging system for use with the present invention.

Referring to FIG. 1, the major components of a preferred MRI system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to a disk storage 28 and a tape drive 30 for storage of image data and programs, and it communicates with a separate system control 32 through a high speed serial link 34. The input device 13 can include a mouse, joystick, keyboard, track ball, touch screen, light wand, voice control, or similar device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator which indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 also receives patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in an assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 during the receive mode. The transmit/receive switch 62 also enables a separate RF coil (for example, a surface coil) to be used in either the transmit or receive mode.

The MR signals picked up by the RF coil 56 are digitized by the transceiver module 58 and transferred to a memory module 66 in the system control 32. When a scan is completed, an array of raw k-space data has been acquired in the memory module 66. As will be described in more detail below, this raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in the disk memory 28. In response to commands received from the operator console 12, this image data may be archived on the tape drive 30, or it may be further processed by the image processor 22 and conveyed to the operator console 12 and presented on the display 16.

The present invention includes a method and system suitable for use with the above-referenced NMR system, or any similar or equivalent system for obtaining MR images.

Figure 2:
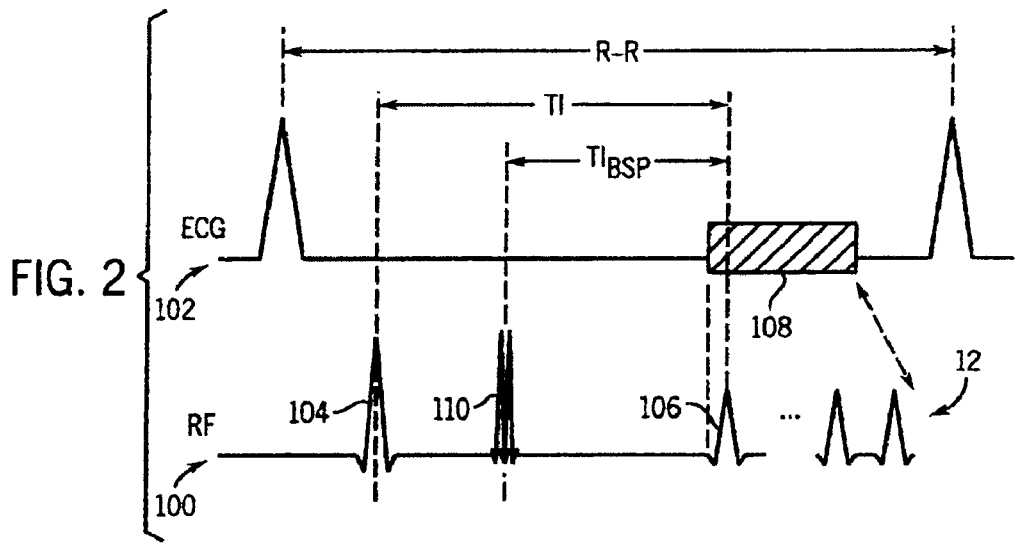
FIG. 2 is a pulse sequence diagram illustrating relative temporal positions of various RF pulses with respect to an R—R interval in accordance with the present invention.

Referring to FIG. 2, the radio-frequency (rf) section of a pulse sequence 100 is shown illustrating the relative temporal positions of various RF pulses and with respect to an R—R interval of an ECG cycle 102. The first RF pulse played out is a slice-selective inversion pulse 104 having an inversion time TI as measured from the peak of the slice-selective inversion pulse 104 to a peak of a first excitation RF pulse 106 for image acquisition 108. The slice-selective inversion pulse 104 is designed with a section thickness of between 1.0 and 3 times the section thickness of an imaged slice, as will be described with reference to FIG. 3. The slice-selective inversion pulse is preferably played out with an inversion time of approximately 100–450 msec, in one embodiment. This inversion time is selected to null signal from normal myocardium and is varied depending on the concentration of the contrast material used (which impacts the residual concentration of the contrast material in normal, healthy myocardium), and the delay time from the initial contrast material administration.

After the slice-selective inversion pulse 104 is transmitted, a notched RF inversion pulse 110 is transmitted to invert the longitudinal magnetization from blood outside of the imaged slice-of-interest. Preferably, the notched RF inversion pulse, also referred to as a blood suppression pulse, has an inversion time $TI_{BSP}$ of approximately 120–150 msec. (in one embodiment). In this manner, the longitudinal magnetization of blood outside of the imaged slice-of-interest recovers from an inverted state through zero or null. It is anticipated that the blood flow during this $TI_{BSP}$ time is sufficient that the blood outside of the imaged slice-of-interest will flow into the region when the image slice is acquired so that the longitudinal magnetization of the blood is close to its null point. This expanded region substantially reduces the signal from blood within the image slice.

As previously alluded to, the pulse sequence 100 also includes at least one, but preferably a number of excitation RF pulses 112 to acquire data 108. The acquisition of data takes place, preferably, in the mid-diastole region. It is also preferable to acquire the data during a single breath-hold by the patient. The excitation RF pulses 112 of the pulse sequence 100 are of a known segmented k-space gradient echo imaging technique. Although the aforementioned technique is described with reference to a two-dimensional acquisition strategy, it is also applicable for a three-dimensional image acquisition sequence with segmented acquisition across multiple cardiac cycles.

Figure 3:
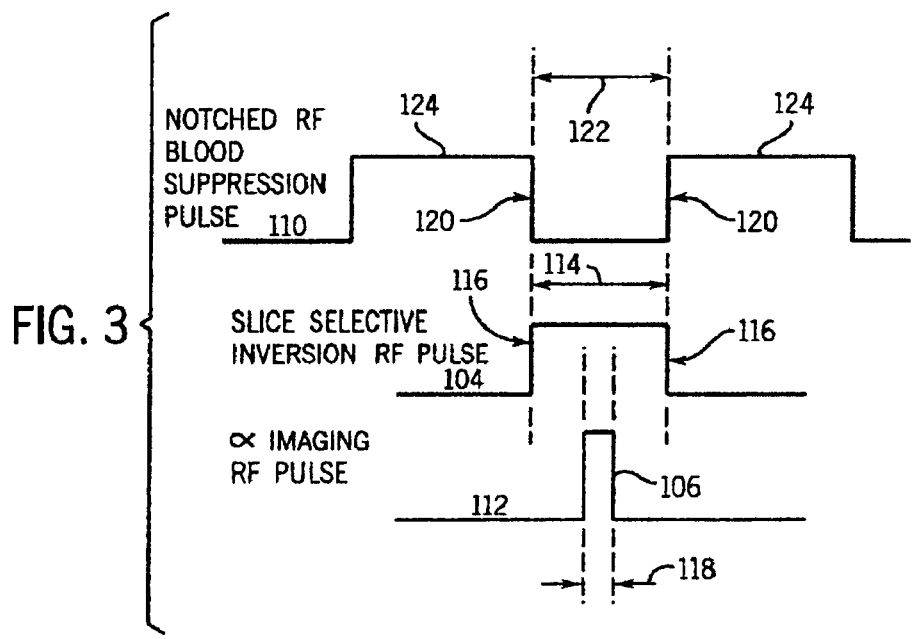
FIG. 3 is a diagram illustrating relative spatial and frequency extents and positions of the RF pulses shown in FIG. 2.

Referring now to FIG. 3, the relative spatial positions and section thickness of the primary slice-selective inversion pulse 104, the notched blood suppression pulse 110, and the imaged slice 106 are shown. Initially, it is noted that the width 114 of the pass-band 116 of the slice-selective inversion RF pulse 104 is selected to accommodate cardiac and respiratory motion of the imaged slice during the inversion time TI. This pass-band 116 is therefore selected approximately 13 or more times that of the imaged section thickness 118. The notched RF suppression pulse 110 has a stop-band 120 that is coincident with that of the pass-band 116 of the primary slice-selective inversion RF pulse 104. The width 122 of the stop-band 120 of the notched RF pulse 110 is sized about the same as that of the pass-band 116 of the slice-selective inversion pulse 104. The pass-bands 124 of the notched RF pulse 110 are sized large enough to invert regions outside the imaged slice 106 to include blood that may flow into the region-of-interest of the imaged slice during data acquisition. Because the inversion time for blood suppression is less than that used for normal myocardial tissue suppression, the inversion time of the blood suppression pulse 110 is less than the inversion time for the slice-selective inversion RF pulse 104. The inversion time of the blood suppression pulse 110 must also take into account the time after the initial contrast material is administered and the amount of the dose administered. It is also noted that the notched RF blood suppression pulse 110 has a 180° flip angle, in one embodiment but can have a flip angle from 90° to 180°.

The application of the notched RF pulse 110 for blood suppression does not affect the primary slice-selective inversion pulse 104 for normal myocardial tissue suppression. Therefore, the equations used to determine the necessary inversion times for both contrast-enhanced blood and normal myocardium are uncoupled and independent. The equations necessary to achieve nulling of normal, healthy myocardium are well known and are given by:

$$M_Z(t) = M_{Z,EQ} \cos \alpha \exp(-t/T_1) + M_o(1 \exp(-t/T_1))$$ (Eqn. 1)

where $M_Z(t)$ is the longitudinal magnetization at the of image acquisition, $M_{Z,EQ}$ is the equilibrium longitudinal magnetization after image acquisition and just prior to application of the inversion recovery rf pulse, $\alpha$ is the inversion recovery rf pulse flip angle, $M_o$ is the thermal equilibrium longitudinal magnetization, $T_1$ is the spin-lattice relaxation time, and t is the time after the inversion pulse. Note that Eqn. (1) is general and applicable to both myocardial suppression and blood suppression:as the technique previously described allows for the uncoupling of the myocardial and blood suppression equations.

The present invention has been shown to be an effective blood suppression technique to detect the presence of infarcted myocardial tissue. Without a blood suppression RF pulse, there is difficulty in distinguishing between enhanced infarcted myocardial tissue and the ventricular blood cavity. With this blood suppression technique, the endo-cardial boundaries of the infarcted tissue can be clearly delineated, thereby allowing better appreciation of the extent of myocardial infarction.

Accordingly, the invention includes a method of MR imaging with blood pool suppression that includes administering a contrast agent into the blood stream of a patient, and then applying a pulse sequence having a slice-selective inversion RF pulse and a notched inversion RF pulse. With a contrast bolus of gadolinium contrast material, and a dosage of between 0.1–0.2 mmol/kg, it is preferable to wait 5–15 minutes after the administration of the contrast material for normal myocardium suppression. The slice-selective RF pulse is designed to suppress myocardial tissue, and is followed by the notched inversion RF pulse that is designed to suppress blood pool. The suppression of blood pool signal is preferably done in a region larger than that where data is acquired so that when acquiring MR data, the blood that has flowed into the region is nulled. An MR image can then be reconstructed from the acquired MR data to assess a presence of myocardial infarction. This technique not only increases the sensitivity to detect infarcted myocardial tissue, but also allows much better discrimination between the endo-cardial boundaries of the infarcted tissue and the ventricular cavity.

The invention also includes a computer programmed to control an MRI system, such as that disclosed with reference to FIG. 1, and also programmed to apply a pulse sequence such as that disclosed with reference to FIGS. 2 and 3. That is, the computer is programmed to transmit a slice-selection inversion pulse to suppress signals from normal myocardial tissue, and then transmit a notched inversion RF pulse with an inversion time selected to invert regions inside and outside of a desired imaging slice such that signals from blood flowing into the desired imaging slice are also suppressed. The computer is also programmed to transmit excitation RF pulses, and then cause the acquisition of data from the desired imaging slice wherein the data has signal suppression from both normal myocardial tissue and blood. Note that to reduce the inversion delay times (TI and $TI_{BSP}$), partial inversion rf pulses with flip angles from 90° to 180° may be used without loss of effect.

Experimental data using the present technique provided results with marked improvement over images without blood suppression. Two sets of images were acquired of the same subject approximately 4 minutes apart. The first set of images had no blood suppression, while the second set employed the blood suppression technique of the present invention. The resulting images show a significant reduction in blood signal and the endo-cardial boundaries of the infarcted tissue that can be clearly differentiated in the blood suppressed images, whereas the images acquired without blood pool suppression do not clearly show the boundaries nor the infarcted areas nearly as well. The acquisition parameters were: 32 cm FOV, 9 mm section thickness, 256 by 192 matrix, 2 NEX, TR/TE/flip=6.6/1.7/20, TI=200 msec, $TI_{BSP}$=150 msec.

The present invention has been described in terms of the preferred embodiment, and it is recognized that equivalents, alternatives, and modifications, aside from those expressly stated, are possible and within the scope of the appending claims.

What is claimed is:

1. A method of MR imaging comprising applying a pulse sequence having a slice-selective inversion RF pulse designed to suppress myocardial tissue followed by a notched inversion RF pulse designed to suppress blood pool at least within a region-of-interest.

2. The method of claim 1 further comprising:
   administering a contrast agent into the blood stream of a patient;
   acquiring MR data in the region-of-interest;
   reconstructing an MR image from the acquired MR data to assess a presence of cardiac syndrome; and
   wherein the slice-selective inversion RF pulse has a section thickness of equal to or greater than a section thickness of an imaged slice and has an inversion time selected to null signal from normal myocardial tissue.

3. The method of claim 2 wherein the inversion time of the slice-selective inversion RF pulse is between 100–450 msec.

4. The method of claim 1 wherein the notched inversion RF pulse has a pass-band and a stop-band, the pass-band designed wide enough to invert regions outside of the region-of-interest to suppress blood that may flow into the region-of-interest when acquiring MR data, and the stop-band designed such that it occurs spatially co-incident with that of the slice-selective inversion RF pulse.

5. The method of claim 1 further comprising the step of detecting presence of infarcted myocardial tissue.

6. The method of claim 5 further comprising the step of waiting 5–15 minutes between administering the contrast agent and applying the pulse sequence for myocardial tissue viability assessment.

7. The method of claim 2 wherein the step of acquiring MR data is further defined as acquiring single-image MR data during a single breath-hold by the patient.

8. The method of claim 2 wherein MR data is acquired during mid-diastole of an R—R interval of the patient.

9. An MR pulse sequence comprising a notched inversion RF pulse following a primary slice-selection inversion RF pulse and having a stop-band co-incident with that of the primary slice-selection inversion RF pulse.

10. The MR pulse sequence of claim 9 further comprising:
a primary slice-selection inversion RF pulse having a pass-band greater in width than that of an image slice pulse;
at least one image slice pulse for a segmented k-space gradient echo imaging segment acquisition separated an inversion time from the notched inversion RF pulse; and
wherein the primary slice-selection inversion RF pulse is designed to suppress selected tissue in an MR exam.

11. The MR pulse sequence of claim 10 wherein the stop-band of the notched inversion RF pulse is centered over the imaging RF pulse such that an imaged slice is not affected by the notched inversion RF pulse.

12. The MR pulse sequence of claim 9 wherein the notched inversion RF pulse has a flip angle of approximately 90°–180°.

13. The MR pulse sequence of claim 9 wherein an inversion time TI of the primary slice-selection inversion RF pulse is greater than the inversion time $TI_{BSP}$ of the notched inversion RF pulse.

14. The MR pulse sequence of claim 9 wherein the notched inversion RF pulse has a pass-band to invert blood pool in a region-of-interest during data acquisition.

15. The MR pulse sequence of claim 14 wherein the inversion time $TI_{BSP}$ of the notched inversion RF pulse is chosen such that blood inverted in the pass-band of the notched inverted RF pulse is at or close to nullification during a gradient echo read-out segment.

16. AN MRI apparatus comprising a computer programmed to transmit a notched inversion RF pulse with an inversion time selected to invert regions inside and outside a desired imaging slice such that signals from blood flowing into the desired imaging slice are suppressed.

17. The MRI apparatus of claim 16 further comprising a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and wherein the computer is further programmed to:

transmit a slice-selection inversion pulse to suppress signals from a first tissue;

transmit excitation RF pulses;

acquire data from the desired imaging slice having signal suppression from both the first tissue and blood;

receive input indicative of contrast agent administration; and allow contrast agent concentration in abnormal regions before the pulse transmissions.

18. The MRI apparatus of claim 17 wherein the slice-selection inversion pulse has a pass-band designed to account for cardiac and respiratory motion during a primary inversion time TI.

19. The MRI apparatus of claim 17 wherein the slice-selective inversion RF pulse has a section thickness about 1 and 3 times that of a section thickness of an imaged slice and has an inversion time selected to null signal from normal myocardial tissue of approximately 100–450 msec.

20. The MRI apparatus of claim 17 wherein the notched inversion RF pulse has a stop-band that is spatially co-incident with that of the slice-selective inversion pulse.

21. The MRI apparatus of claim 17 wherein data is acquired mid-diastole for each image during a single breath-hold by the patient.

\* \* \* \* \*